(12) United States Patent
Abiko et al.

(10) Patent No.: US 7,541,285 B2
(45) Date of Patent: Jun. 2, 2009

(54) SUBSTRATE PROCESSING APPARATUS AND SUBSTRATE PROCESSING METHOD

(75) Inventors: Yoshitaka Abiko, Kyoto (JP); Toshio Hiroe, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 268 days.

(21) Appl. No.: 11/464,622

(22) Filed: Aug. 15, 2006

(65) Prior Publication Data
US 2007/0042511 A1    Feb. 22, 2007

(30) Foreign Application Priority Data
Aug. 19, 2005   (JP)   ............... 2005-238259

(51) Int. Cl.
*H01L 21/302* (2006.01)
(52) U.S. Cl. .................................... 438/689
(58) Field of Classification Search .............. None
See application file for complete search history.

(56) References Cited

U.S. PATENT DOCUMENTS

| 6,164,297 A | 12/2000 | Kamikawa |
| 6,375,758 B1 | 4/2002 | Nakashima et al. |
| 2001/0051439 A1* | 12/2001 | Khan et al. ............ 438/710 |
| 2003/0045098 A1* | 3/2003 | Verhaverbeke et al. ...... 438/689 |

FOREIGN PATENT DOCUMENTS

| EP | 1068936 | 1/2001 |
| JP | 11-8217 | 1/1999 |
| JP | 11-8218 | 1/1999 |
| JP | 2927806 | 5/1999 |
| JP | 2001-102349 | 4/2001 |
| JP | 2004-063513 | 2/2004 |

OTHER PUBLICATIONS

Office Action issued by the Korean Patent Office on Jul. 20, 2007 in connection with corresponding Korean Patent Application No. 10-2006-0078142.
Translation of the Office Action issued by the Korean Patent Office on Jul. 20, 2007 in connection with corresponding Korean Patent Application No. 10-2006-0078142.
**U.S. patent 6,375,758 corresponds to JP 11-8218—Additionally, a brief description is provided in English by applicant.
*U.S. patent 6,164,297 corresponds to JP 11-8217—Additionally, a brief description is provided in English by applicant.

* cited by examiner

*Primary Examiner*—Charles D. Garber
*Assistant Examiner*—Andre' C Stevenson
(74) *Attorney, Agent, or Firm*—Ostrolenk, Faber, Gerb & Soffen, LLP

(57) ABSTRACT

A substrate processing apparatus performs a chemical solution process in a chemical solution process room that is partially formed within a chamber. During the chemical solution process, the substrate processing apparatus seals the chemical solution process room, and measures the pressure within the chemical solution process room, and controls the pressure within the chemical solution process room, based on a measured value. Irrespective of location environment of the substrate processing apparatus, the chemical solution process room can be controlled to a predetermined pressure. The substrate processing apparatus also permits efficient pressure control with respect to a minimum required amount of region.

6 Claims, 6 Drawing Sheets

F I G. 5
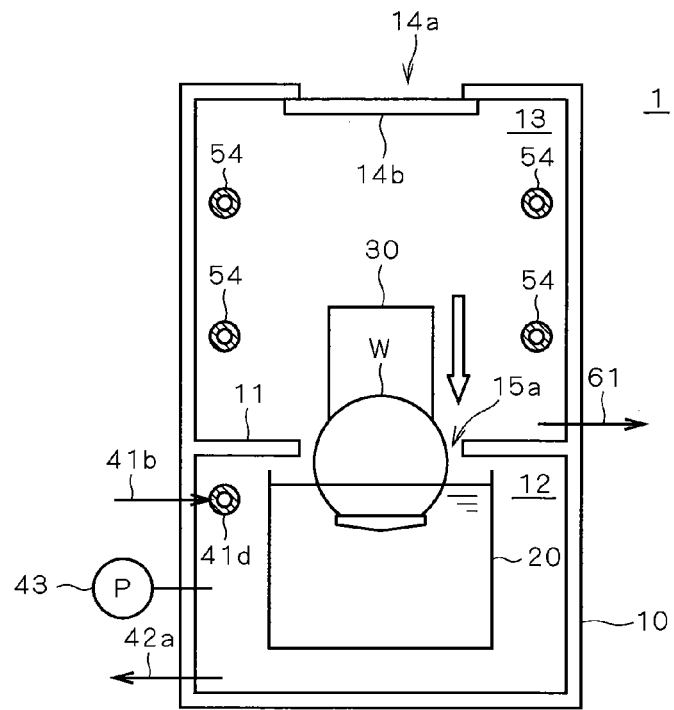
F I G. 6
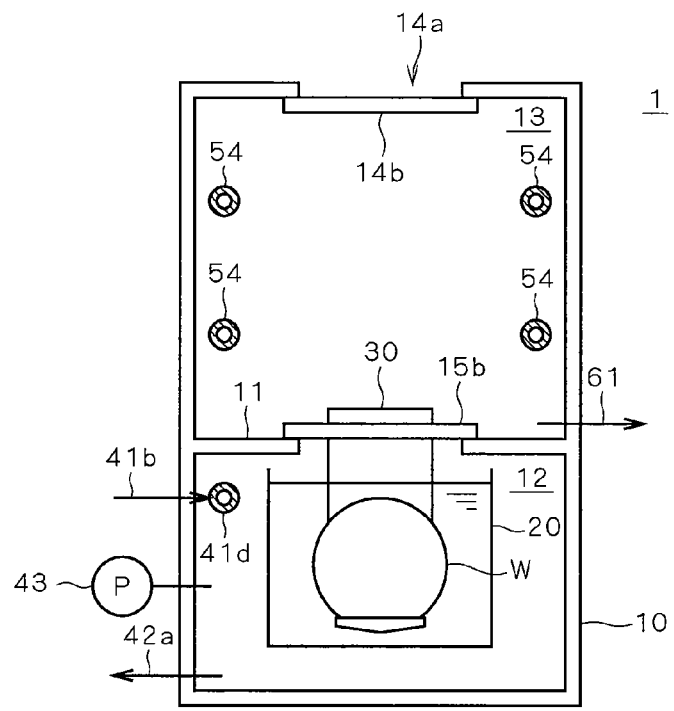

SUBSTRATE PROCESSING APPARATUS AND SUBSTRATE PROCESSING METHOD

BACKGROUND OF THE INVENTION

1. Field of the Invention

The present invention relates to a substrate processing apparatus that performs a predetermined process of substrates such as semiconductor substrates, glass substrates for liquid crystal display devices, and glass substrates for photomasks, and to a substrate processing method.

2. Description of the Background Art

Conventionally, known in the manufacturing steps of substrates is a substrate processing apparatus that performs a process such as a cleaning process of the substrates within a chamber. For example, there is known a substrate processing apparatus in which a chemical solution is stored in a cleaning bath disposed within the chamber, and a cleaning process is carried out by immersing substrates in the chemical solution.

Such a substrate processing apparatus is placed and used at various locations. Consequently, the atmosphere around the substrate processing apparatus is not always constant. For example, the atmosphere around the substrate processing apparatus when placed at a low location differs from that when placed at a high location. The atmosphere around the substrate processing apparatus may also vary according to the weather and the setting of a clean room in a factory.

A change in the atmosphere around the substrate processing apparatus changes the pressure within the chamber unless the pressure is specially controlled. If the pressure within the chamber is controlled, only by a relative pressure control of the chamber on the basis of ambient atmosphere, a change in the ambient atmosphere may change the pressure within the chamber. It is therefore difficult for the conventional substrate processing apparatus to maintain the pressure within the chamber constant irrespective of location environment.

Additionally, when the pressure within the chamber is controlled in the conventional substrate processing apparatus, the whole of the chamber including a processing part is subjected to pressure control. Nevertheless, the pressure control covering the whole of the chamber has poor efficiency of pressure control because the chamber further includes a region other than the processing part.

SUMMARY OF THE INVENTION

The present invention is directed to a substrate processing apparatus that performs a predetermined process of a substrate.

According to one aspect of the present invention, a substrate processing apparatus includes: a) a chamber; b) a partition member that partitions a processing space partially formed within the chamber; c) a processing part that processes the substrate with a processing solution in the processing space; d) a measuring part that measures pressure within the processing space; and e) a pressure adjusting part that adjusts the pressure within the processing space, based on a measurement on the measuring part.

The processing space can be controlled to a predetermined pressure irrespective of location environment of the substrate processing apparatus. The substrate processing apparatus also permits efficient pressure control with respect to a minimum required amount of region, because the processing space is a space partially formed in the chamber.

Preferably, the pressure adjusting part includes: e-1) a gas supplying part that supplies gas into the processing space; e-2) a gas exhausting part that exhausts gas within the processing space; and e-3) a controller that controls a flow of at least one of the gas supplying part and the gas exhausting part.

This enables the pressure within the processing space to be controlled speedily and easily.

Preferably, the processing space is a first processing room where the substrate is subjected to a chemical solution process, and the partition member partitions the interior of the chamber into the first processing room, and a second processing room where the substrate is subjected to a demonized water process, between the first processing room and a gate, through which the substrate is loaded and unloaded with respect to the chamber.

The second processing room is disposed between the gate and the first processing room in the chamber. This prevents gas generated by vaporization of a chemical solution in the first processing room from being exhausted to the exterior of the chamber. This also prevents the air in the exterior of the chamber from entering into the first processing room, thereby preventing the chemical solution from being deteriorated in the first processing room.

Preferably, the first processing room and the second processing room are arranged vertically in the chamber.

This permits a reduction in the footprint of the substrate processing apparatus (the floor space of the substrate).

The present invention is also directed to a substrate processing method for performing a predetermined process of a substrate.

Accordingly, an object of the present invention is to provide a technique of efficiently controlling the pressure within the chamber to a predetermined pressure, irrespective of location environment of the substrate processing apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 to 9 are diagrams, each illustrating the situation of a process at a corresponding stage in the substrate processing apparatus.

DESCRIPTION OF THE PREFERRED EMBODIMENTS

Preferred embodiments of the present invention will be described below with reference to the accompanying drawings.

<1. Construction of Substrate Processing Apparatus>

Figure 1:
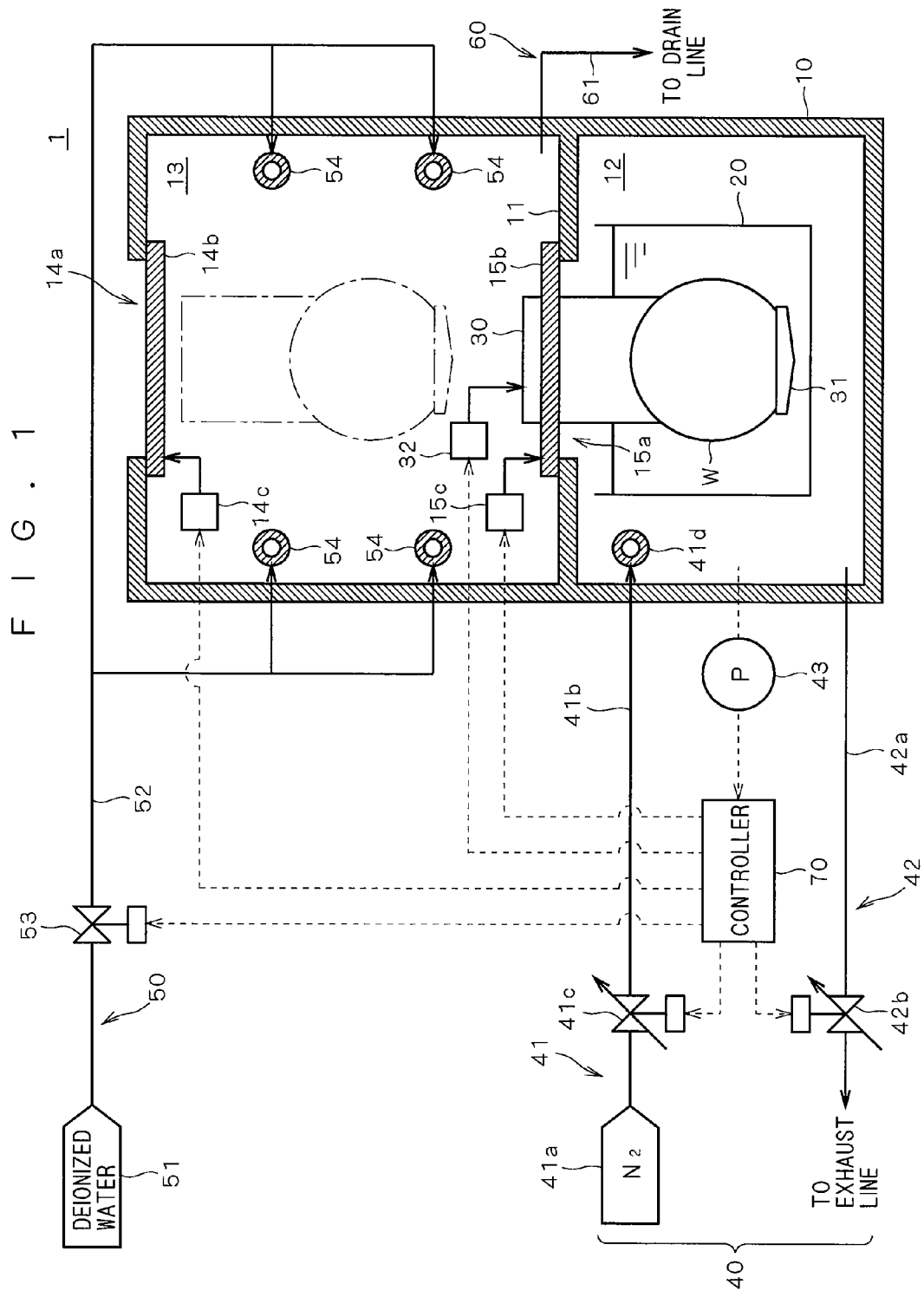
FIG. 1 is a diagram illustrating the construction of a substrate processing apparatus according to the present invention.

FIG. 1 is a diagram illustrating the construction of a substrate processing apparatus 1 according to the present invention. The substrate processing apparatus 1 performs a batch transportation of a plurality of substrates (hereinafter referred to simply as "substrates") W, and performs a chemical solution process and a washing process. The substrate processing apparatus 1 consists mainly of a chamber 10, a processing bath 20, a lifter 30, a pressure adjusting part 40, a deionized water supplying part 50, a drain part 60, and a controller 70.

The chamber 10 is a casing that has in its interior a space for processing the substrates W. The chamber 10 has two processing rooms arranged vertically via a partition member 11. The processing room disposed below the partition member 11 is a chemical solution process room 12 where the substrates W are subjected to the chemical solution process. The process room disposed above the partition member 11 is a washing process room 13 where the substrates W are subjected to the washing process. The external walls of the chamber 10 and the partition member 11 are formed of an airtight material.

The upper surface of the washing process room 13 (namely the upper surface of the chamber 10) is provided with a gate 14a, through which the substrates W are loaded and unloaded, and a slide door 14b that opens and closes the gate 14a. The slide door 14b opens and closes the gate 14a by a sliding movement thereof caused by a driving mechanism 14c that is conceptually illustrated in FIG. 1. Closing the gate 14a by the slide door 14b separates the atmosphere within the chamber 10 from the atmosphere in the exterior of the chamber 10. On the other hand, opening the gate 14a allows the substrates W to be loaded and unloaded through the gate 14a.

The partition member 11 between the chemical solution process room 12 and the washing process room 13 is provided with a transfer gate 15a, through which the substrates W are transferred, and a slide door 15b that opens and closes the transfer gate 15a. The slide door 15b opens and closes the gate 14a by a sliding movement thereof caused by a driving mechanism 15c that is conceptually illustrated in FIG. 1. A sealing member such as an 0 ring is secured to a portion of the slide door 15b which is brought into contact with the transfer gate 15a. Hence, when the slide door 15b closes the transfer gate 15a, the atmosphere within the chemical process room 12 is separated from the atmosphere in the exterior of the chemical process room 12. On the other hand, when the gate 15a is opened, the substrates W can be transferred through the gate 15a.

The chemical process room 12 is a region partially formed in the chamber 10. In other words, the chemical solution room 12 contains less gas than the whole of the chamber 10. Further, a washing process room using no chemical solution is interposed between the chemical solution process room 12 and the gate 14a. This eliminates the possibility that the atmosphere containing the chemical solution is directly exhausted from the chemical solution process room 12 to the exterior of the chamber 10.

The processing bath 20 is disposed within the chemical solution process room 12. The processing bath 20 is a container for storing a chemical solution. The substrate processing apparatus 1 performs a chemical solution process of the substrates W by immersing them in the chemical solution stored in the processing bath 20. Examples of the chemical solution used here are a SPM solution (a mixed solution of sulfuric acid and hydrogen peroxide water), hydrofluoric acid, SC-1, SC-2, phosphoric acid, and organic solvent. A chemical solution supplying part and a chemical solution discharging part, which are not shown, are connected to the processing bath 20. When starting a process of the substrates W, a chemical solution is supplied from the chemical solution supplying part to the processing bath 20. On termination of the process of the substrates W, the chemical solution is discharged from the processing bath 20 to the chemical solution discharging part. The processing bath 20 may be provided with a circulating part that circulates the chemical solution within the processing bath 20.

The lifter 30 is a mechanism that holds and transports vertically the substrates W in the chamber 10. The lifter 30 has a platform 31 that holds the substrates W from below, and holds the substrates W in their stand states on the platform 31. The lifter 30 is connected to a driving mechanism 32 that is conceptually illustrated in FIG. 1. When the driving mechanism 32 is operated, the lifter 30 is moved vertically, so that the substrates W are moved between an immersing position in the processing bath 20 (the position indicated by the solid line in FIG. 1) and a lifting position in the washing process room 13 (the position indicated by a virtual line in FIG. 1).

The pressure adjusting part 40 is a mechanism for adjusting the pressure within the chemical solution process room 12. The pressure adjusting part 40 has a gas supplying part 41 that supplies nitrogen gas into the chemical solution process room 12, a gas exhausting part 42 that exhausts the gas within the chemical solution process room 12, and a measuring part 43 that measures the pressure within the chemical solution process room 12.

The gas supplying part 41 is constructed so that piping 41b provides a connection between a nitrogen gas supply source 41a and the chemical solution process room 12, and a valve 41c is interposed in the piping 41b. The piping 41b is connected to a nitrogen gas discharging part 41d in the chemical solution process room 12. Therefore, when the valve 41c is opened, the nitrogen gas is supplied from the nitrogen gas supply source 41a via the piping 41b and the nitrogen gas discharging part 41d to the chemical solution process room 12. A variable flow valve is used as the valve 41c. Adjusting the opening of the valve 41c regulates the flow of the nitrogen gas supplied to the chemical solution process room 12.

The gas exhausting part 42 is constructed so that piping 42a provides a connection between the chemical solution process room 12 and an exhaust line, and a valve 42b is interposed in the piping 42a. The exhaust line has a predetermined exhaust pressure. Therefore, when the valve 42b is opened, the gas within the chemical solution process room 12 is exhausted via the piping 42a to the exhaust line. A variable flow valve is used as the valve 42b. Adjusting the opening of the valve 42b regulates the flow of the gas exhausted from the chemical solution process room 12.

The deionized water supplying part 50 is a mechanism for supplying deionized water into the washing process room 13. The deionized water supplying part 50 is constructed so that piping 52 provides a connection between the deionized water supply source 51 and the washing process room 13, and a valve 53 is interposed in the piping 52. The piping 52 is connected to a plurality of deionized water discharging portions 54 arranged in the washing process room 13. Therefore, when the valve 53 is opened, deionized water is supplied from the deionized water supply source 51 via the piping 52 and the deionized water discharging portions 54 into the washing process room 13. A plurality of the deionized water discharging portions 54 are disposed on the right and left sides of the washing process room 13. Each of the deionized water discharging portions 54 is provided with a plurality of discharging holes (not shown) directed to the substrates W lifted into the washing process room 13. The deionized water discharging portions 54 discharge deionized water in the shape of shower, through the plurality of the discharging holes to the substrates W.

The drain part 60 is a mechanism for draining the deionized water within the washing process room 13. The drain part 60 has piping 61 that provides a connection between the washing process room 13 and a drain line. The deionized water discharged from the deionized water discharging portions 54 washes the surfaces of the substrates W, and then drops on the slide door 15b and the upper surface of the partition member 11. The deionized water dropped on the slide door 15b and the upper surface of the partition member 11 is then drained via the piping 61 to the drain line. The washing process room 13 is further provided with an exhaust part (not shown) for exhausting the gas within the washing process room 13.

The controller is configured by a computer equipped with a CPU and a memory, for example. The controller 70 is electrically connected to the above-mentioned measuring part 43, and receives measurements from the measuring part 43. The controller 70 is also connected to the above-mentioned driving mechanisms 14c, 15c, and 32, and to the above-mentioned valves 41c, 42b, and 53, in order to control their respective operations. Particularly, the controller 70 controls the valves 41c and 42b in the pressure adjusting part 40, based on the measurements on the measuring part 43. Thus, the amount of gas supplied to the chemical solution process room 12, and the amount of gas exhausted from the chemical solution process room 12 are controlled to regulate the pressure within the chemical solution process room 12.

<2. Operation of Substrate Processing Apparatus>

Figure 2:
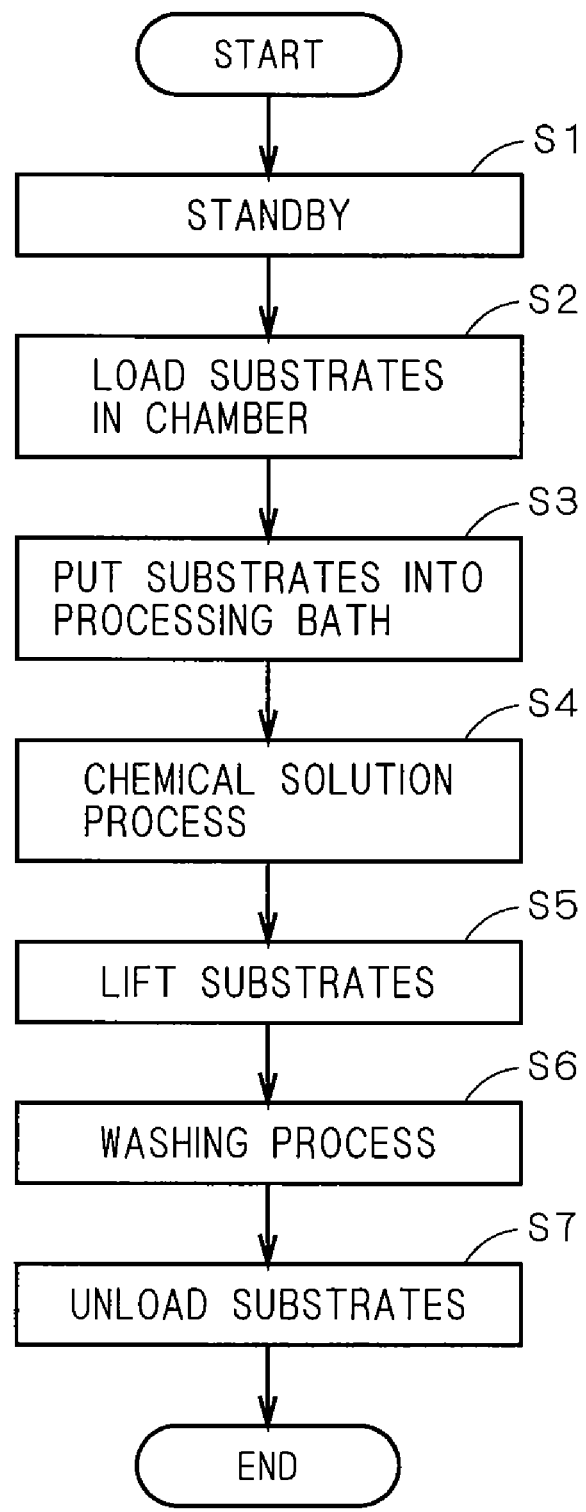
FIG. 2 is a flow chart illustrating the flows of a chemical solution process and washing process in the substrate processing apparatus.

FIG. 2 is a flow chart illustrating the flows of a chemical solution process and a washing process with the above-mentioned substrate processing apparatus 1. FIGS. 3 to 9 are diagrams, each illustrating the situation of the process at a corresponding stage in the substrate processing apparatus 1. The operation of the substrate processing apparatus 1 will be described below with reference to FIGS. 2 and FIGS. 3 to 9. The following operations will proceed by controls of the driving mechanisms 14c, 15c, and 32, and the valves 41c, 42b, and 53, each of which is effected by the controller 70.

Figure 3:
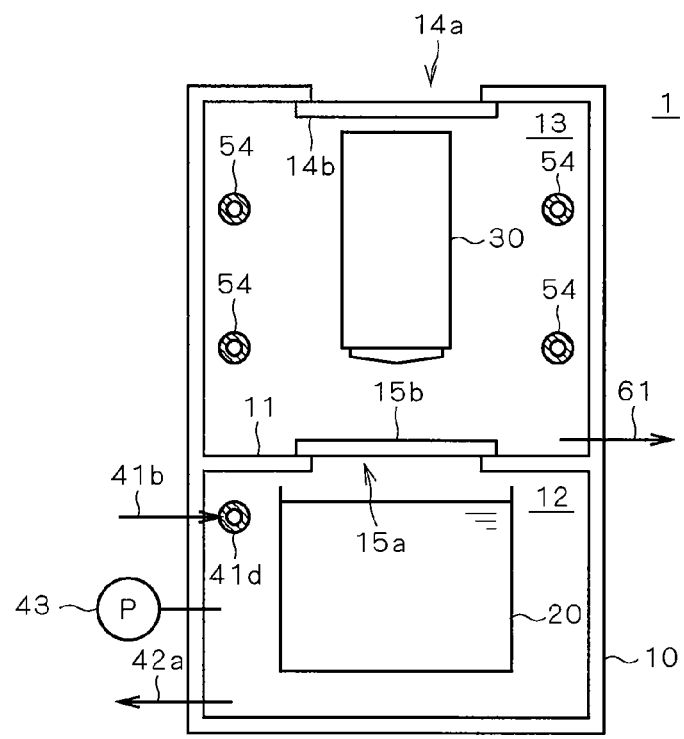

When the substrates W are processed with the substrate processing apparatus 1, the substrate processing apparatus 1 firstly stores a chemical solution in the processing bath 20, and waits for loading of the substrates W (step S1, refer to FIG. 3). Specifically, the lifter 30, which is placed within the washing process room 13, waits for loading of the substrates W. At this time, the slide door 15b between the chemical solution process room 12 and the washing process room 13 is closed. Therefore, the gas generated by vaporization of the chemical solution within the processing bath 20 does not enter into the washing process room 13. In the chemical solution process room 12, the nitrogen gas discharging part 41d supplies nitrogen gas, and the gas within the chemical solution process room 12 is exhausted into the piping 42a. Therefore, the gas generated by vaporization of the chemical solution within the processing bath 20 can be exhausted from the piping 42a to the exhaust line.

Figure 4:
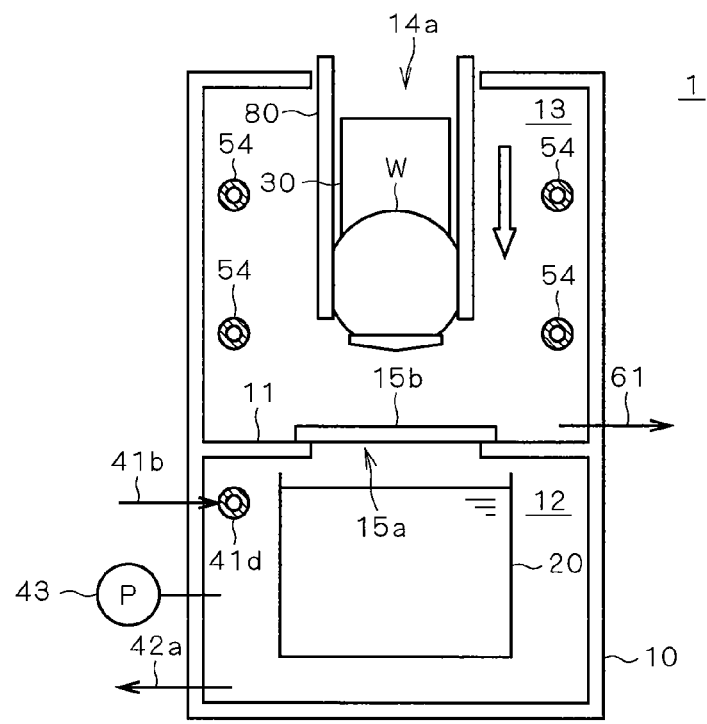

On termination of transportation of the substrates W from the device of the previous step, the substrate processing apparatus 1 opens the slide door 14b, and loads the substrates W into the chamber 10 through the gate 14a (step S2, refer to FIG. 4). By a predetermined transport robot 80, the substrates W are transported into the chamber 10 and then placed on the lifter 30 waiting at the washing process room 13. At this point, the slide door 15b remains closed, and the nitrogen gas supply and the gas exhaust remain continued in the chemical solution process room 12.

On termination of loading of the substrates W into the chamber 10, the substrate processing apparatus 1 closes the slide door 14b above the chamber 10. The substrate processing apparatus 1 then opens the slide door 15b and brings down the lifter 30 to put the substrates W into the processing bath 20 (step S3, refer to FIG. 5). The substrates W are immersed together with the lifter 30 into the chemical solution within the processing bath 20. At this time, the substrate processing apparatus 1 increases the opening of the valve 42b so that the amount of exhaust from the chemical solution process 12 to the piping 42a is increased to strongly exhaust the gas within the chemical solution process room 12. This avoids that gas generated by vaporization of the chemical solution in the chemical solution process room 12 enters into the washing process room 13.

With the substrates W immersed in the chemical solution, the substrate processing apparatus 1 closes the slide door 15b to bring again the chemical solution process room 12 into the close state thereof. The substrate processing apparatus 1 then performs the chemical solution process of the substrates W in the processing bath 20 (step S4, refer to FIG. 6). At this time, the substrate processing apparatus 1 measures the pressure within the chemical solution process room 12 by using the measuring part 43, and controls the opening of the valve 41 and the valve 42b, based on the measured values. Thus, the amount of gas supplied to the chemical solution process room 12, and the amount of gas exhausted from the chemical solution process room 12 are adjusted so as to control the pressure within the chemical solution process room 12 to a predetermined value. For example, an increase in the amount of gas supplied to the chemical solution process room 12, and a decrease in the amount of gas exhausted from the chemical solution process room 12 produce an increase in the pressure within the chemical solution process room 12. A decrease in the amount of gas supplied to the chemical solution process room 12, and an increase in the amount of gas exhausted from the chemical solution process room 12 produce a decrease in the pressure within the chemical solution process room 12. This pressure control is an absolute control based on the measurements on the measuring part 43, not a relative control based on the ambient atmosphere. Hence, the pressure within the chemical solution process room 12 can be controlled precisely irrespective of the ambient atmosphere.

Figure 7:
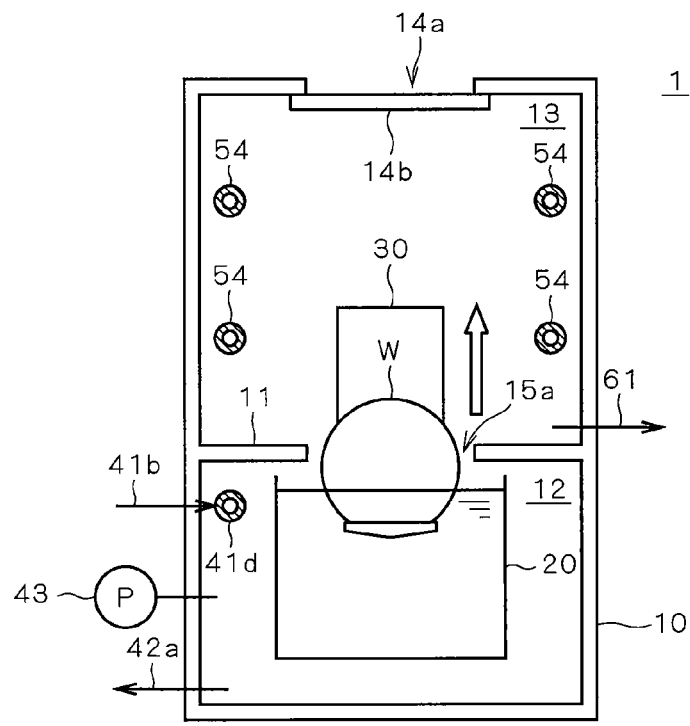

On termination of the chemical solution process for a predetermined time, the substrate processing apparatus 1 opens the slide door 15b and brings up the lifter 30 so as to lift the substrates W from the processing bath 20 (step S5, refer to FIG. 7). At this time, the substrate processing apparatus 1 increases the opening of the valve 42b so that the amount of gas exhaust from the chemical solution process 12 to the piping 42a is increased to strongly exhaust the gas within the chemical solution process room 12. This avoids that the gas generated by vaporization of the chemical solution in the chemical solution process room 12 enters into the washing process room 13.

Figure 8:
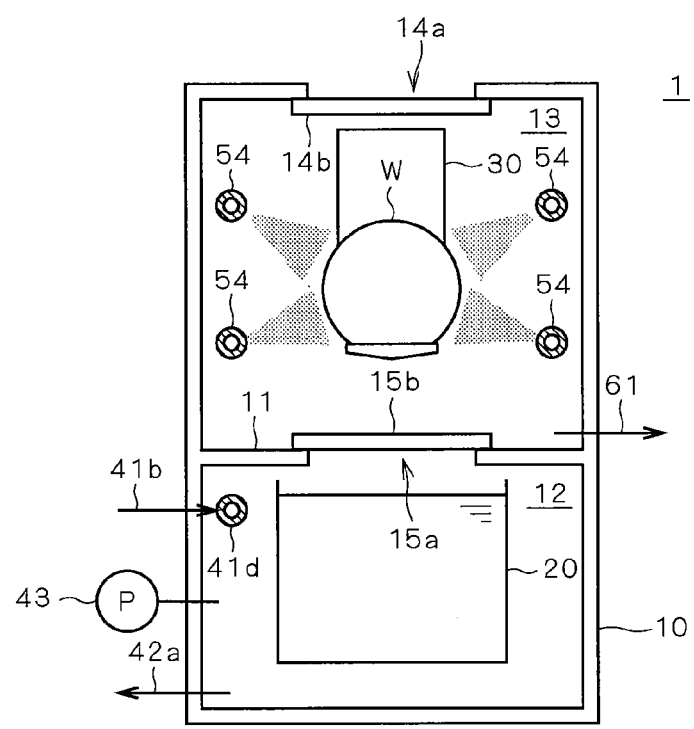
Figure 9:
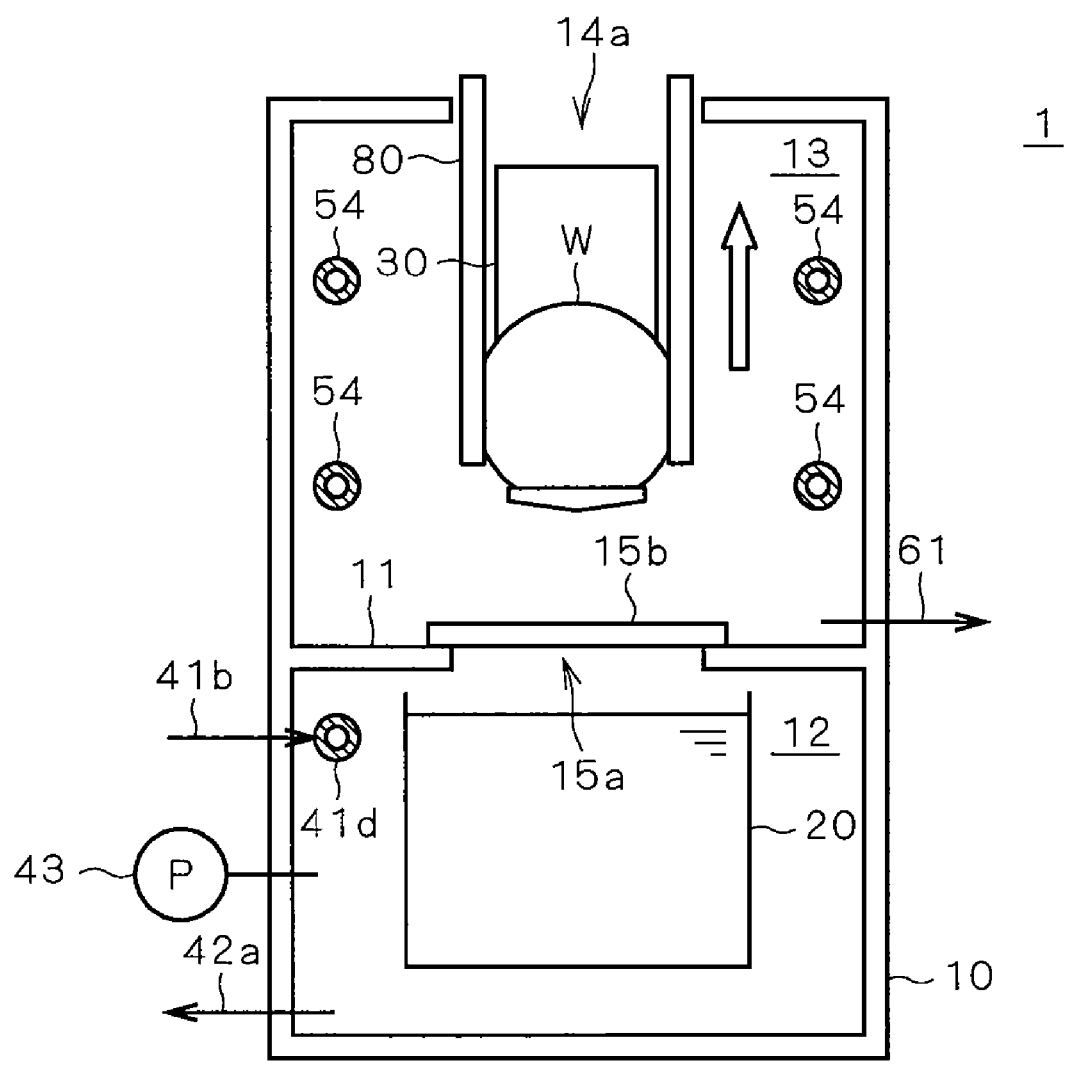

On termination of lifting of the substrates W into the washing process room 13, the substrate processing apparatus 1 closes the slide door 15b, and discharges deionized water through the deionized water discharging portions 54 so as to perform a washing process of the substrates W (step S6, refer to FIG. 8). The deionized water is discharged in the shape of shower, through the deionized water discharging portions 54 to the substrates W, thereby washing the surfaces of the substrates W. The deionized water dropped on the slide door 15b and the upper surface of the partition member 11 is drained via the piping 61 to the drain line.

On termination of the washing process for a predetermined time, the substrate processing apparatus 1 stops discharge of deionized water through the deionized water discharging portions 54. The substrate processing apparatus then opens the slide door 14b above the chamber 10, and unloads the substrates W through the gate 14a to the exterior of the chamber 10 (step S7, refer to FIG. 9). The substrates W are transferred from the lifter 30 to the transport robot 80, and then unloaded to above the chamber 10. This completes the process of a group of the substrates W in the substrate processing apparatus 1.

As discussed above, the substrate processing apparatus 1 closes the slide door 15b to seal the chemical solution process room 12 during the time the chemical solution process is performed. The substrate processing apparatus 1 measures the pressure within the chemical solution process room 12, and adjusts the pressure within the chemical solution process room 12 based on the measurements. Irrespective of location environment of the substrate processing apparatus 1, the chemical solution process room can be controlled to a predetermined pressure. Further, because the chemical solution process room 12 is the region partially formed in the chamber 10, the substrate processing apparatus 1 also permits efficient pressure control with respect to a minimum required amount of region.

The controller 70 may control the pressure within the chemical solution process room 12 according to the content of a chemical solution process. This enables the substrate processing apparatus 1 to adjust the pressure within the chemical solution process room 12 to a pressure that best suits for the process of the substrates W. For example, the substrate processing apparatus 1 can improve the effect of the chemical solution process, and also facilitate chemical reaction by pressurizing or decompressing the interior of the chemical solution process room 12. The controller 70 may change the pressure within the chemical solution process room 12 according to the progress of the chemical solution process.

Further, in the substrate processing apparatus 1, the washing process room 13 using no chemical solution is disposed between the chemical solution process room 12 and the gate 14a. This avoids that the gas generated by vaporization of the chemical solution within the chemical solution process room 12 is exhausted to the exterior to the chamber 10. This also avoids that the air in the exterior of the chamber 10 enters into the chemical solution process room 12. Hence, when using a chemical solution that is susceptible to deterioration if subjected to air, the deterioration of the chemical solution is avoidable.

Furthermore, in the substrate processing apparatus 1, the chemical solution process room 12 and the washing process room 13 are arranged vertically in the chamber 10. This permits a reduction in the footprint of the substrate processing apparatus 1 (the floor space of the substrate 1).

<3. Modifications>

Although one embodiment of the present invention has been disclosed and described, it is apparent that other embodiments and modification of the invention are possible. For example, although the above-mentioned substrate processing apparatus 1 controls both of the amount of gas supplied to the chemical solution process room 12 and the amount of gas exhausted from the chemical solution process room 12, based on the measured values on the measuring part 43, both controls are not always needed. That is, the substrate processing apparatus 1 can regulate the pressure within the chemical solution process room 12 by controlling at least one of the amount of gas supplied to the chemical solution process room 12 and the amount of gas exhausted from the chemical solution process room 12. For example, the substrate processing apparatus 1 may control the amount of gas exhausted by the gas exhausting part 42, with the amount of nitrogen gas supplied by the gas supplying part 41 held constant. Alternatively, the substrate processing apparatus 1 may control the amount of nitrogen gas supplied by the gas supplying part 41, with the amount of gas exhausted by the gas exhausting part 42 held constant.

Although in the foregoing substrate processing apparatus 1, the chamber 10 is partitioned vertically so that the washing process room 13 is disposed on the upper side, and the chemical solution process room 12 is disposed on the lower side, it is not necessarily required to arrange so. For example, other small chamber may be arranged in the interior of the chamber 10 so as to use the small chamber as a chemical solution process room, and an upper position of the small chamber as a washing process room.

Although the foregoing substrate processing apparatus 1 performs the batch process of the substrates W, it may process the substrates W one by one. Although the foregoing substrate processing apparatus 1 performs the chemical solution process by immersing the substrates W into the chemical solution stored in the processing bath 20, the chemical solution process may be carried out by discharging the chemical solution against the substrates W.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus that performs a predetermined process of a substrate comprising:
   a) a chamber having a first processing room and a second processing room;
   b) a partition member that vertically partitions said chamber into said first processing room, and said second processing room;
   c) a processing part that processes the substrate with a chemical solution in said first processing room;
   d) a measuring part that measures pressure within said first processing room; and
   e) a pressure adjusting part that adjusts the pressure within said first processing room, based on a measurement on said measuring part, wherein said processing part comprises:
   c-1) a processing bath that stores a chemical solution and is disposed within said first processing room; and
   c-2) a holding part that holds and immerses the substrates in the chemical solution stored in said processing bath,
   said first processing room and said second processing room are arranged vertically in said chamber relative to each other, and
   said second processing room is provided with a plurality of deionized water discharging portions through which deionized water is supplied to the substrate.

2. The substrate processing apparatus according to claim 1 wherein,
   said partition member is provided with a transfer gate to permit passage of the substrate, and a door to open and close said transfer gate; and
   said pressure adjusting part adjusts the pressure within said first processing room, with said door closed.

3. The substrate processing apparatus according to claim 2 wherein, said pressure adjusting part comprises:
   e-1) a gas supplying part that supplies gas into said first processing room;
   e-2) a gas exhausting part that exhausts gas within said first processing room; and
   e-3) a controller that controls a flow of at least one of said gas supplying part and said gas exhausting part.

4. The substrate processing apparatus according to claim 3 wherein,
   said second processing room is disposed between said first processing room and a gate through which the substrate is loaded and unloaded with respect to said chamber 5. The substrate processing apparatus according to claim 4 wherein, said holding part transports the substrate between said first processing room and said second processing room.

6. The substrate processing apparatus according to claim 5 wherein, said controller adjusts pressure within said first processing room according to a content of a process in said processing part.

* * * * *